(12) United States Patent
Chui

(10) Patent No.: US 9,357,623 B2
(45) Date of Patent: May 31, 2016

(54) PROTECTION CIRCUIT IN TRIAC APPLICATIONS

(75) Inventor: Siew Yong Chui, Singapore (SG)

(73) Assignee: Marvell World Trade Ltd., St. Michael (BB)

( * ) Notice: Subject to any disclaimer, the term of this patent is extended or adjusted under 35 U.S.C. 154(b) by 34 days.

(21) Appl. No.: 13/557,268

(22) Filed: Jul. 25, 2012

(65) Prior Publication Data

US 2013/0044524 A1    Feb. 21, 2013

Related U.S. Application Data

(60) Provisional application No. 61/525,639, filed on Aug. 19, 2011.

(51) Int. Cl.
| | |
|---|---|
| *H02H 3/00* | (2006.01) |
| *H05B 39/02* | (2006.01) |
| *H02H 7/22* | (2006.01) |
| *H03K 17/082* | (2006.01) |
| *H03K 17/687* | (2006.01) |

(52) U.S. Cl.
CPC ............... *H05B 39/02* (2013.01); *H02H 7/222* (2013.01); *H03K 17/0822* (2013.01); *H03K 2017/6875* (2013.01)

(58) Field of Classification Search
CPC ..... H05B 39/02; H02H 7/222; H03K 17/0822
USPC .......................................................... 361/86
See application file for complete search history.

(56) References Cited

U.S. PATENT DOCUMENTS

| | | | |
|---|---|---|---|
| 3,506,905 A | 4/1970 | Thomas | |
| 6,469,564 B1 * | 10/2002 | Jansen | 327/365 |
| 6,583,997 B1 * | 6/2003 | Reid et al. | 363/50 |
| 6,781,502 B1 * | 8/2004 | Robb | 337/167 |
| 7,888,881 B2 * | 2/2011 | Shteynberg et al. | 315/291 |
| 8,111,017 B2 * | 2/2012 | Lin et al. | 315/307 |

FOREIGN PATENT DOCUMENTS

| | | |
|---|---|---|
| CN | 1836193 A | 9/2006 |
| DE | 2 054 858 A1 | 5/1972 |

OTHER PUBLICATIONS

U.S. Appl. No. 13/557,765, filed Jul. 25, 2012, by Ravishanker Krishnamoorthy et al., entitled "Method and Apparatus for Triac Applications."
U.S. Appl. No. 13/557,265, filed Jul. 25, 2012, by Siew Yong Chui et al., entitled "Start-Up Circuit."
Office Action issued Mar. 30, 2015 in European Patent Application No. 12 780 801.2.

* cited by examiner

*Primary Examiner* — Thienvu Tran
*Assistant Examiner* — Tien Mai

(57) ABSTRACT

Aspects of the disclosure provide a circuit. The circuit includes a transistor configured to control energy entering the circuit from a power supply, a capacitor coupled with the transistor to store the energy that enters the circuit, and a protection circuit configured to counteract a voltage change of the transistor that is caused by a step voltage change in the power supply. In an embodiment, the protection circuit operates independent of the stored energy on the capacitor.

21 Claims, 5 Drawing Sheets

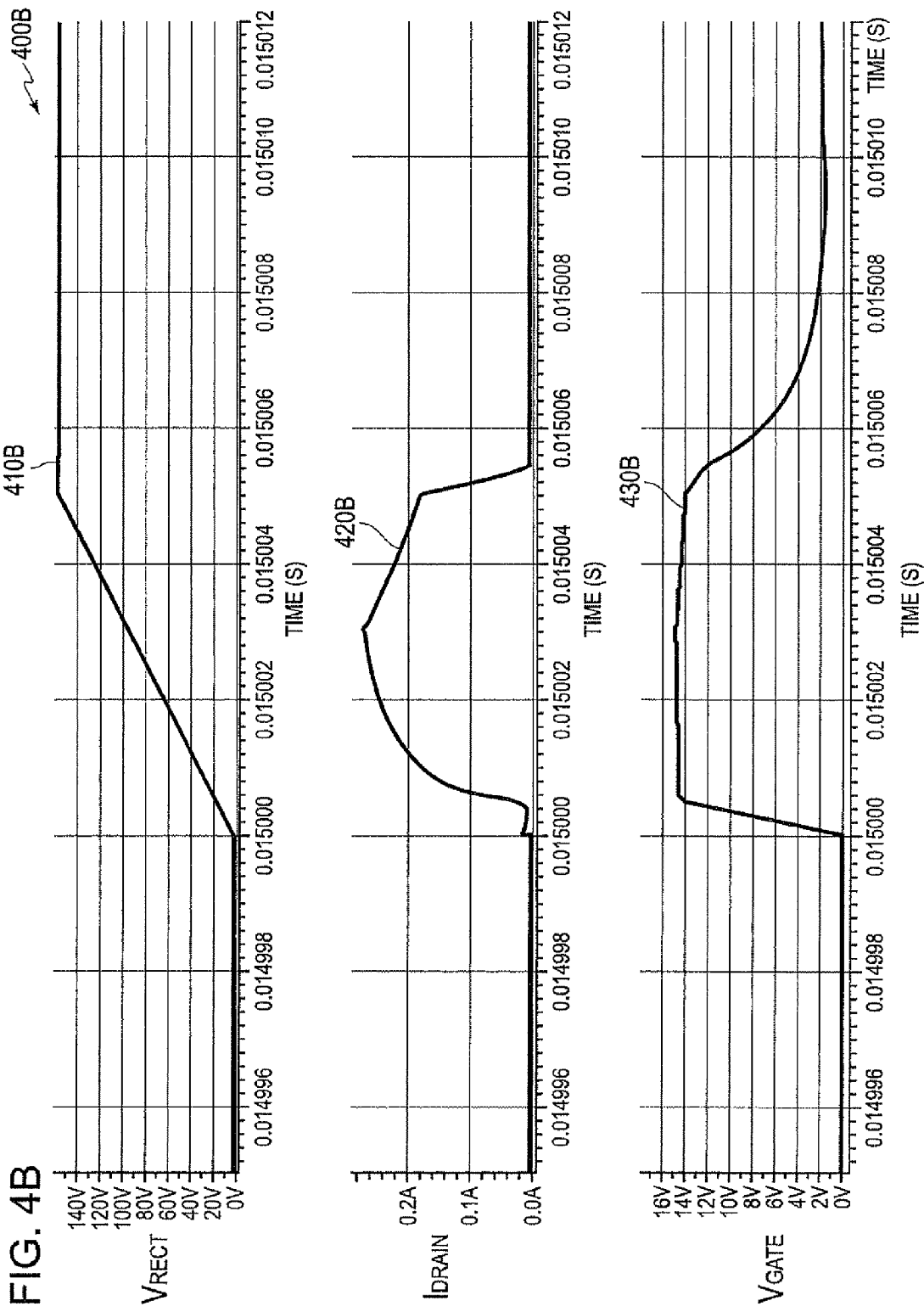

PROTECTION CIRCUIT IN TRIAC APPLICATIONS

INCORPORATION BY REFERENCE

This present disclosure claims the benefit of U.S. Provisional Application No. 61/525,639, "Protection Circuit for UHV Device in TRIAC Applications" filed on Aug. 19, 2011, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Many electrical and electronic devices are controlled by dimmers to change output characteristics of the devices. In an example, a dimmer is used to change light output from a lighting device. In another example, a dimmer is used to change rotation speed of a fan.

SUMMARY

Aspects of the disclosure provide a circuit. The circuit includes a transistor configured to control energy entering the circuit from a power supply, a capacitor coupled with the transistor to store the energy that enters the circuit, and a protection circuit configured to counteract a voltage change of the transistor that is caused by a step voltage change in the power supply. In an embodiment, the protection circuit is configured to operate independent of the stored energy on the capacitor.

Further, in an example, the circuit includes a control circuit configured to control the transistor based on the energy stored on the capacitor.

In an embodiment, the transistor is a depletion mode transistor, such as a depletion mode metal-oxide-semiconductor-field-effect-transistor (MOSFET). Then, the protection circuit is coupled to a gate terminal of the transistor to counteract a gate voltage change on the gate terminal of the transistor caused by the step voltage change in the power supply.

According to an aspect of the disclosure, the transistor is a first transistor and the protection circuit includes a second transistor configured to discharge the gate terminal of the first transistor in response to the step voltage change in the power supply. Further, the protection circuit includes a resistor defining a time constant for the protection circuit to be operative.

Aspects of the disclosure provide a method. The method includes storing energy that enters into a circuit via a transistor that controls the energy entering the circuit from a power supply, and receiving a step voltage change in the power supply. The step voltage change causes a voltage change on the transistor. The method includes counteracting the voltage change on the transistor by a protection circuit. In an embodiment, the protection circuit operates independent of the stored energy.

Aspects of the disclosure provide an electronic system. The electronic system includes a rectifier and a circuit. The rectifier is configured to receive and rectify an AC power supply and generate a rectified power supply. The circuit includes a transistor configured to control energy entering the circuit from the rectified power supply, a capacitor coupled with the transistor to store the energy that enters the circuit, and a protection circuit configured to counteract a voltage change of the transistor that is caused by a step voltage change in the rectified power supply. The electronic system can include other components, such as a dimmer, a transformer, and the like.

BRIEF DESCRIPTION OF THE DRAWINGS

Various embodiments of this disclosure that are proposed as examples will be described in detail with reference to the following figures, wherein like numerals reference like elements, and wherein:

FIGS. 4A-4B show waveforms according to an embodiment of the disclosure.

DETAILED DESCRIPTION OF EMBODIMENTS

Figure 1:
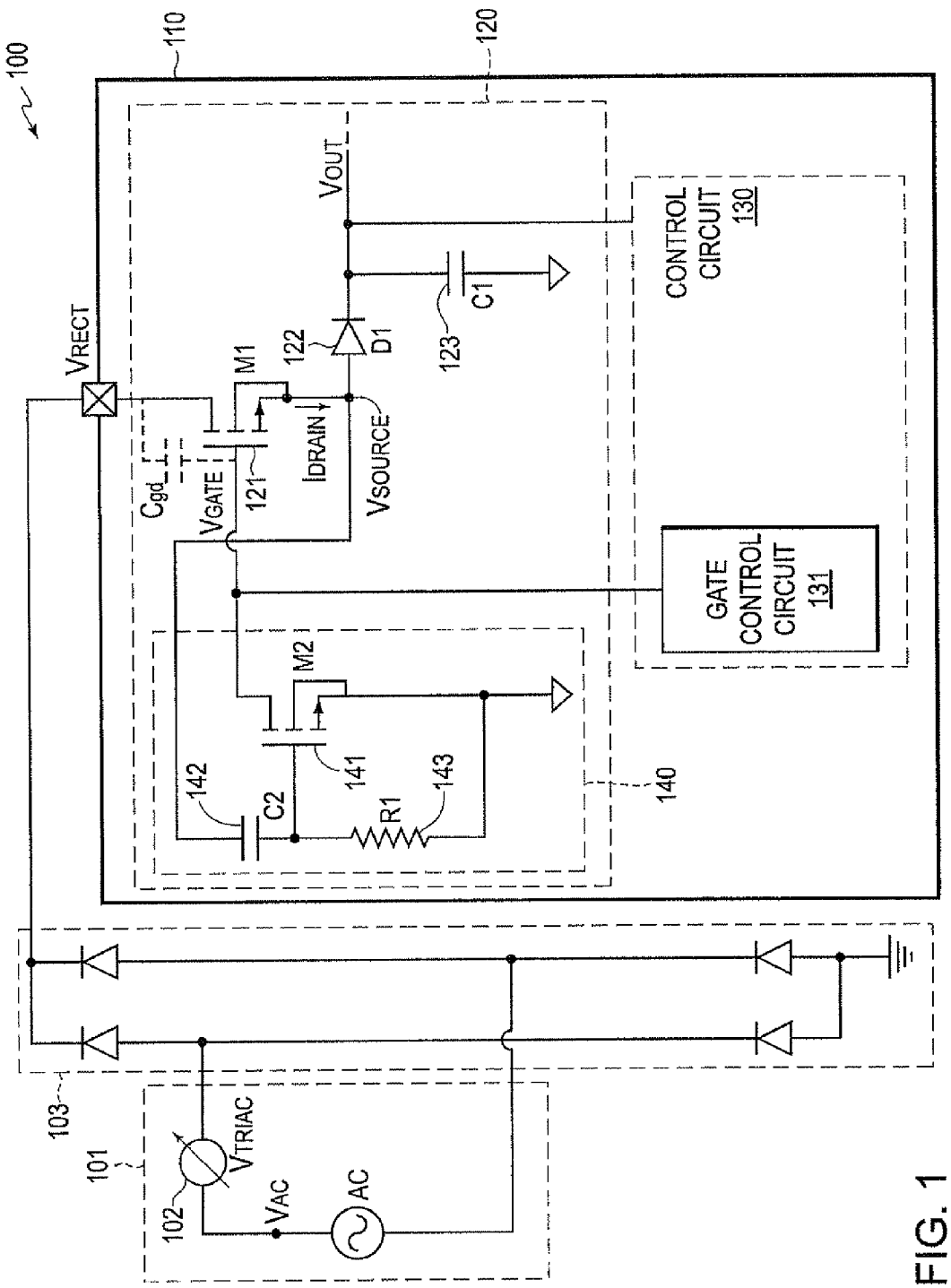
FIG. 1 shows an electronic system 100 according to an embodiment of the disclosure.

FIG. 1 shows an electronic system 100 coupled to an energy source 101 according to an embodiment of the disclosure. The electronic system 100 includes a rectifier 103 and a circuit 110 coupled together as shown in FIG. 1.

The energy source 101 provides electric energy to the electronic system 100. In the FIG. 1 example, the energy source 101 is an alternating current (AC) voltage supply to provide an AC voltage $V_{AC}$, such as 110V AC supply voltage, 220V AC supply voltage, and the like. In addition, the energy source 101 includes suitable elements to adjust the provided electric energy. For example, the energy source 101 includes a dimmer 102 to suitably adjust the amount of electric energy provided to the electronic system 100.

In an embodiment, the dimmer 102 is a phase angle based dimmer. In an example, the AC voltage supply has a sine wave shape, and the dimmer 102 is a forward-type triode for alternating current (TRIAC) dimmer 102 having an adjustable dimming angle $\alpha$ within $[0, \pi]$. Every time the AC voltage $V_{AC}$ crosses zero, the forward-type TRIAC dimmer 102 stops firing charges for a dimming angle $\alpha$. Thus, in each cycle $[0, 2\pi]$, when the phase of the AC voltage $V_{AC}$ is within $[0, \alpha]$ or $[\pi, \pi+\alpha]$, the TRIAC voltage $V_{TRIAC}$ output from the forward-type TRIAC dimmer 102 is zero; and when the phase of the AC voltage $V_{AC}$ is within $[\alpha, \pi]$ or $[\pi+\alpha, 2\pi]$, the TRIAC voltage $V_{TRIAC}$ follows the AC voltage $V_{AC}$. Generally, $[0, \alpha]$ and $[\pi, \pi+\alpha]$ are referred to as non-conduction angle. Similarly, $[\alpha, \pi]$ and $[\pi+\alpha, 2\pi]$ are referred to as conduction angle.

According to another embodiment of the disclosure, the electronic system 100 includes a dimmer (not shown). The dimmer in the electronic system 100 can be similarly configured as the dimmer 102 in FIG. 1; the description has been provided above and will be omitted here for clarity purposes.

According to an embodiment of the disclosure, the electronic system 100 is suitably coupled with the energy source 101. In an example, the electronic system 100 includes a power cord that can be manually plugged into a wall outlet (not shown) on a power grid. In another example, the electronic system 100 is coupled to the energy source 101 via a switch (not shown). When the switch is switched on, the electronic system 100 is coupled to the energy source 101, and when the switch is switched off, the electronic system 100 is decoupled from the energy source 101.

The rectifier 103 rectifies the received AC voltage to a fixed polarity, such as to be positive. In the FIG. 1 example, the rectifier 103 is a bridge rectifier 103. The bridge rectifier 103 receives the AC voltage, generates a rectified voltage $V_{RECT}$, and provides the rectified voltage $V_{RECT}$ to other components of the electronic system 100, such as the circuit 110 and the like, to provide electric power to the electronic system 100.

In an embodiment, the circuit 110 is implemented on a single integrated circuit (IC) chip. In another embodiment, the circuit 110 is implemented on multiple IC chips. The electronic system 100 can include other suitable components, such as a transformer (not shown), a light bulb (not shown), a plurality of light emitting diodes (LEDs) (not shown), a fan (not shown), another circuit (not shown), and the like, that are suitably coupled with the circuit 110. In an example, the circuit 110 provides control signals to control the operations of the other components. In another example, the circuit 110 receives feedback signals from the other components indicative of the operations of the other components, and provides the control signals to control the operations of the other components based on the feedback signals.

According to an embodiment of the disclosure, the circuit 110 includes a regulator circuit 120 and a control circuit 130. The regulator circuit 120 is configured to receive electric energy, store and regulate the received electric energy, and provide the electric energy to other circuit, such as the control circuit 130, to enable the operation of the other circuit. In an example, the regulator circuit 120 receives the rectified voltage $V_{RECT}$, regulate and maintain a voltage $V_{OUT}$ having a relatively constant voltage value in a desired range, and provide the voltage $V_{OUT}$ to other circuits, such as the control circuit 130, to enable the operations of the other circuits. The control circuit 130 is configured to generate control signals to control, for example, the regulator circuit 120 to maintain the voltage $V_{OUT}$.

According to an aspect of the disclosure, the regulator circuit 120 is also a start-up circuit to initially receive power supply and setup the voltage $V_{OUT}$. Specifically, in an embodiment, the circuit 110 has an initial power receiving stage and a normal operation stage. In an example, when a power cord of the electronic system 100 is plugged in the wall outlet, the regulator circuit 120 starts to receive power supply, and the circuit 110 enters the initial power receiving stage. In another example, when a switch is switched on that couples the electronic system 100 with the energy source 101, the regulator circuit 120 starts to receive power supply, and the circuit 110 enters the initial power receiving stage.

During the initial power receiving stage, the regulator circuit 120 starts to receive power supply and sets up the voltage $V_{OUT}$. In an example, the regulator circuit 120 includes a capacitor 123 (C1), and the voltage $V_{OUT}$ is the voltage on the capacitor 123. During the initial power receiving stage, the regulator circuit 120 charges up the capacitor 123. According to an embodiment of the disclosure, the control circuit 130 requires a supply voltage to be larger than a threshold. Thus, in an example, before the voltage $V_{OUT}$ on the capacitor 123 is charged up to a certain level, such as about 15-volt and the like, the control circuit 130 is unable to provide suitable control signals to the regulator circuit 120, and the regulator circuit 120 is in a self-control operation mode that the regulator circuit 120 operates without control from other circuits.

When the voltage $V_{OUT}$ on the capacitor 123 is charged up to the certain level, the voltage $V_{OUT}$ is large enough to enable the operations of the control circuit 130, and the circuit 110 enters the normal operation stage. During the normal operation stage, the control circuit 130 provides suitable control signals to the regulator circuit 120 to control the operations of the regulator circuit 120 in order to maintain the voltage $V_{OUT}$ on the capacitor 123.

According to another aspect of the disclosure, the circuit 100 includes a separate start-up circuit (not shown) to initially receive power supply and setup the voltage $V_{OUT}$. Specifically, in an embodiment, the circuit 110 has an initial power receiving stage and a normal operation stage. In an example, when a power cord of the electronic system 100 is plugged in the wall outlet, the separate start-up circuit starts to receive power supply, and the circuit 110 enters the initial power receiving stage. In another example, when a switch is switched on that couples the electronic system 100 with the energy source 101, the separate start-up circuit starts to receive power supply, and the circuit 110 enters the initial power receiving stage.

During the initial power receiving stage, the separate start-up circuit starts to receive power supply and sets up the voltage $V_{OUT}$. During the initial power receiving stage, the separate start-up circuit charges up the capacitor 123. In an example, the separate start-up circuit is configured in a self-control operation mode that operates without control from other circuits to charge the capacitor 123. According to an embodiment of the disclosure, the control circuit 130 requires a supply voltage to be larger than a threshold. Thus, in an example, before the voltage $V_{OUT}$ on the capacitor 123 is charged up to a certain level, the control circuit 130 is unable to provide suitable control signals to the regulator circuit 120. The regulator circuit 120 may not operate during the initial power receiving stage.

When the voltage $V_{OUT}$ on the capacitor 123 is charged up to the certain level, the voltage $V_{OUT}$ is large enough to enable the operations of the control circuit 130, and the circuit 110 enters the normal operation stage. During the normal operation stage, the separate start-up circuit is disabled. The control circuit 130 provides suitable control signals to the regulator circuit 120 to control the regulator circuit 120 to suitably charge the capacitor 123 to maintain the voltage $V_{OUT}$ on the capacitor 123.

According to another aspect of the disclosure, the regulator circuit 120 is configured only as a start-up circuit to initially charge the capacitor 123 from zero V to a certain level, such as 15V, and to enable the control circuit 130 to operation. In an example, when the control circuit 130 is enabled, the control circuit 130 controls a switch (not shown) coupled to a transformer (not shown) to control the transformer to transform the electric energy from the rectified voltage $V_{RECT}$ to an appropriate form. The control circuit 130 is then powered by the transformed electric energy, and the regulator circuit 120 is suitably disabled.

In the FIG. 1 example, the regulator circuit 120 includes a transistor 121 (M1) coupled with a diode 122 (D1) to charge the capacitor 123. In an embodiment, the transistor 121 is a depletion mode transistor, such as an N-type depletion mode metal-oxide-semiconductor-field-effect-transistor (MOSFET) that has a negative threshold voltage (e.g., negative 3V), configured to be conductive when control voltages are not available. For example, when the regulator circuit 120 serves as a start-up circuit during the initial power receiving stage, because the gate-to-source and the gate-to-drain voltages of the N-type depletion mode MOSFET 121 are about zero and are larger than the negative threshold voltage, thus an N-type conductive channel exists between the source and drain of the N-type depletion mode MOSFET 121 even without a gate control voltage. The N-type depletion mode MOSFET 121 allows an inrush current to enter the circuit 100 and charge the capacitor 123 at the time when the circuit 100 enters the initial power receiving stage. Further, when the circuit 100 enters the normal operation mode, the control circuit 130 provides control signals to control the N-type depletion mode MOSFET 121 to charge the capacitor 123 and maintain the voltage on the capacitor 123.

In another embodiment, the transistor 121 is an enhance mode transistor, such as an N-type enhance mode MOSFET 121 having a positive threshold (e.g., positive 3V). Then, during the initial power receiving stage, a separate start-up circuit charges up the capacitor 123; and during the normal operation stage, the separate start-up circuit is disabled, and the control circuit 130 provides control signals to the regulator circuit 120, such as a gate control voltage to the N-type enhance mode MOSFET 121, to control the capacitor charging and maintain the voltage on the capacitor 123.

In the FIG. 1 example, the control circuit 130 includes a gate control circuit 131. In an embodiment, the gate control circuit 131 is coupled to the transistor 121 and the capacitor 123 to form a feedback loop to detect the voltage on the capacitor, and control the transistor 121 based on the detected voltage to maintain the voltage on the capacitor 123. For example, when the gate control circuit 131 detects that the voltage on the capacitor 123 drops to a lower limit of a desired range, the gate control circuit 131 turns on the transistor 121 to charge the capacitor 123; when the gate control circuit 131 detects that the voltage on the capacitor 123 increases to an upper limit of the desired range, the gate control circuit 131 turns off the transistor 121 to stop charging the capacitor 123.

Further, in the FIG. 1 example, the regulator circuit 120 includes a protection circuit 140 to protect the regulator circuit 120 from negative effects of step voltage changes in the rectified voltage $V_{RECT}$. According to an aspect of the disclosure, because the transistor 121 is coupled to the rectified voltage $V_{RECT}$ as energy entrance to the circuit 110, no matter whether the regulator circuit 120 is enabled or disabled, step voltage changes in the rectified voltage $V_{RECT}$ affect the transistor 121.

According to an embodiment of the disclosure, when the dimmer angle of the dimmer 102 is non-zero, the rectified voltage $V_{RECT}$ has a step voltage change when the phase of the AC voltage $V_{AC}$ changes from a non-conductive angle to a conductive angle.

Figure 2:
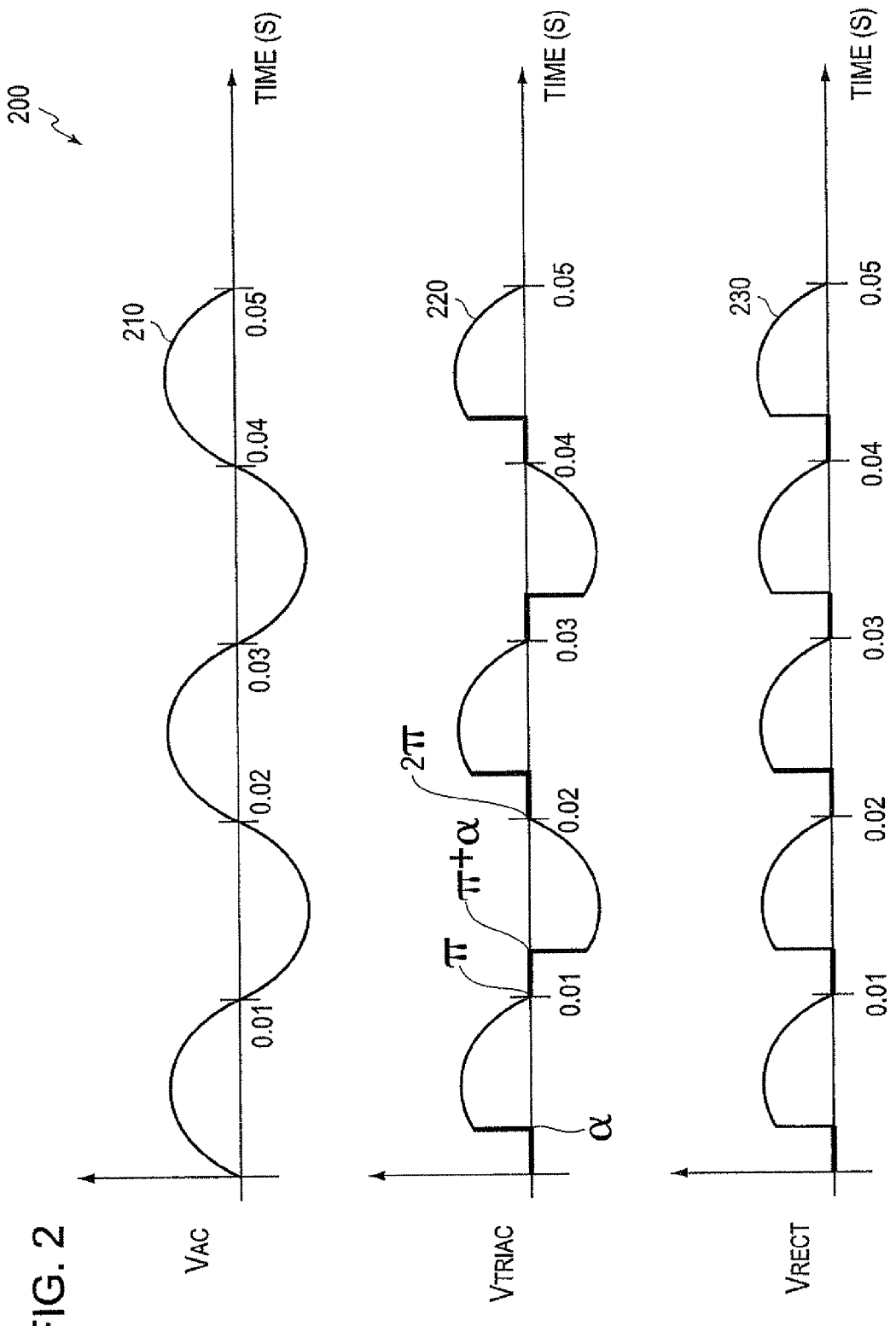
FIG. 2 shows waveforms for a power supply according to an embodiment of the disclosure.

FIG. 2 shows a plot 200 of waveforms for the energy source 101 according to an embodiment of the disclosure. The plot 200 includes a first waveform 210 for the AC supply voltage $V_{AC}$, a second waveform 220 for the TRIAC voltage $V_{TRIAC}$, and a third waveform 230 for the rectified voltage $V_{RECT}$.

As can be seen in FIG. 2, the AC voltage $V_{AC}$ has a sinusoidal waveform, and has a frequency of 50 Hz. The TRIAC voltage $V_{TRIAC}$ is zero when the phase of the AC voltage is in the non-conduction angle and follows the shape of the AC voltage $V_{AC}$ when the phase of the AC voltage is in the conductive angle. The rectified voltage $V_{RECT}$ is rectified from the TRIAC voltage $V_{TRIAC}$ to have positive polarity.

Specifically, in the FIG. 2 example, the dimmer 102 has a dimming angle α. In each cycle [0, 2π], when the phase of the AC voltage $V_{AC}$ is within [0, α] or [π, π+α], the TRIAC voltage $V_{TRIAC}$ output from the forward-type TRIAC dimmer 102 is about zero, and the rectified voltage $V_{RECT}$ is about zero; when the phase of the AC voltage $V_{AC}$ is within [α, π], the AC voltage $V_{AC}$ is positive, the TRIAC voltage $V_{TRIAC}$ follows the AC voltage $V_{AC}$, and the rectified voltage $V_{RECT}$ is about the same as the TRIAC voltage $V_{TRIAC}$; and when the phase of the AC voltage $V_{AC}$ is within [π+α, 2π], the AC voltage $V_{AC}$ is negative, the TRIAC voltage $V_{TRIAC}$ follows the AC voltage $V_{AC}$, and the rectified voltage $V_{RECT}$ is about negative of the TRIAC voltage $V_{TRIAC}$.

Thus, in each cycle [0, 2π], when the phase of the AC voltage $V_{AC}$ is at α or at π+α, the rectified voltage $V_{RECT}$ has a step voltage change. The amplitude of the step voltage change depends on the dimming angle α. In an example, when the dimming angle is α/2, the rectified voltage $V_{RECT}$ has the largest step voltage change. It is noted that the step voltage change happens in a short time, such as in less than 5 μs.

According to an embodiment of the disclosure, the step voltage change in the rectified voltage $V_{RECT}$ may negatively affect a regulator circuit. For example, without the protection circuit 140, when the rectified voltage $V_{RECT}$ has a step voltage change, the step voltage change is coupled to the gate terminal of the transistor 121 via gate-drain capacitance Cgd, and thus increases the gate voltage of the transistor 121. When the gate voltage of the transistor 121 is larger than the threshold voltage, the transistor 121 is conductive, and allows electric energy to enter the circuit 110. In an example, when the step voltage change is relatively large, a relatively large amount of current passes through the transistor 121. Because the rectified voltage $V_{RECT}$ is also large, a large amount of electric energy enters the circuit 110 in a short time and may damage the circuit 110, such as the transistor 121, and the like.

According to an embodiment of the disclosure, it may take a relatively long time for the feedback loop formed by the transistor 121, the capacitor 123 and the gate control circuit 131 to react to the step voltage change.

According to an embodiment of the disclosure, the protection circuit 140 responds to the step voltage change in a relatively short time, such as in the order of 200 ns and the like, to counteract the influence of the step voltage change on the transistor 121, such as to reduce the gate voltage of the transistor 121, and thus reduce the amount of electric energy that enters the circuit 110 during the step voltage change period.

In the FIG. 1 example, the protection circuit 140 includes a transistor 141 (M2), a capacitor 142 (C2), and a resistor 143 (RI) coupled together as shown in FIG. 1. In an example, the transistor 141 is an N-type enhance mode MOSFET having a positive threshold voltage. The drain terminal of the transistor 141 is coupled to the gate terminal of the transistor 121, the gate terminal of the transistor 141 is coupled to the source terminal of the transistor 121 via the capacitor 142, and the source terminal of the transistor 141 is connected to the ground, the resistor 143 is connected between the gate terminal of the transistor 141 and the ground.

During operation, before the rectified voltage $V_{RECT}$ has a step voltage change, the gate voltage of the transistor 141 is tied to ground by the resistor 143, and thus the transistor 141 is turned off, and the gate terminal of the transistor 121 is controlled by the gate control circuit 131 to maintain the voltage on the capacitor 123, in an example. In another example, before a power start-up, the voltage on the capacitor 123 is zero, and the control circuit 130 is unable to operate, the gate voltage and source voltage of the transistor 121 are about zero.

When the rectified voltage $V_{RECT}$ has a step voltage change, the step voltage change causes the gate voltage of the transistor 121 to increase due to the Cgd coupling. When the gate voltage of the transistor 121 is larger than the threshold of the transistor 121, the transistor 121 is turned on. When the transistor 121 is turned on, the source voltage $V_{SOURCE}$ of the transistor 121 is pulled up. The increase of the source voltage $V_{SOURCE}$ is coupled to the gate terminal of the transistor 141 via the capacitor 142, and pulls up the gate voltage of the transistor 141. Then, the transistor 141 is turned on to pull down the gate voltage of the transistor 121 to counteract the effect of the Cgd coupling.

Further, the resistor 143 forms a discharging path to discharge the gate terminal of the transistor 141 and to re-tie the gate terminal of the transistor 141 to ground. The resistance of the resistor 143 can be suitably determined to set a time constant to discharge the gate terminal of the transistor 142 and tie the gate terminal of the transistor 142 to ground.

According to an aspect of the disclosure, the protection circuit 140 is self-powered, and does not rely on the electric energy stored on the capacitor 123 or an electric energy transformed under the control of the control circuit 130. Thus, in an example, when the regulator circuit 120 is disabled, the protection circuit 140 can still operate and protect the circuit 110. Further, the protection circuit 140 does not require control from other circuit, and responds to the step voltage change in a self-controlled manner. In addition, the protection circuit 140 reacts to the step voltage change, and pulls down the gate voltage of the transistor 121 in a relatively short time, such as in the order of 200 ns.

Figure 3:
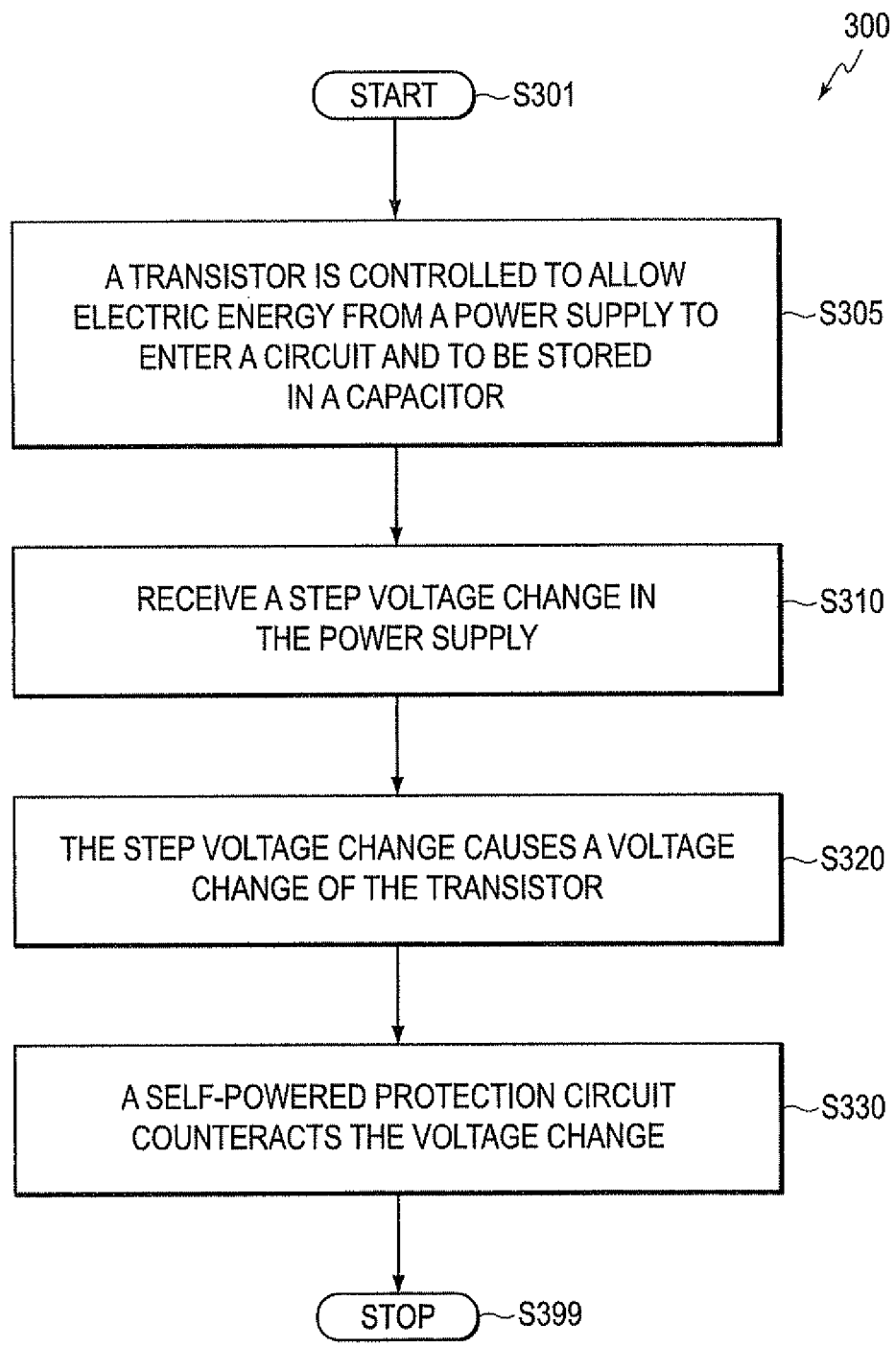
FIG. 3 shows a flowchart outlining a process 300 according to an embodiment of the disclosure.

FIG. 3 shows a flowchart outlining a process 300 according to an embodiment of the disclosure. The circuit 110 operates according to the process 300 to protect the circuit 110 from damage due to step voltage change in the power supply. The process starts at S301, and proceeds to S305.

At S305, the transistor 121 in the circuit 110 is controlled as an energy entrance to control electric energy from the power supply $V_{RECT}$ to enter the circuit 110 and to be stored in the capacitor 123.

At S310, the circuit 110 receives a step voltage change in the power supply. In an example, the dimming angle of the dimmer 102 is non-zero. Thus, the rectified voltage $V_{RECT}$ is about zero when the phase of the AC power supply corresponds to non-conduction angle, and follows the AC voltage $V_{AC}$ when the phase of the AC power supply corresponds to conduction angle. Thus, when the phase of the AC voltage $V_{AC}$ changes from the non-conduction angle to the conduction angle, the rectified voltage $V_{RECT}$ has a step voltage change.

At S320, the step voltage change causes a voltage change of the transistor 121. For example, the step voltage change is coupled to the gate terminal of the transistor 121 by the gate-drain capacitance Cgd, and increases the gate voltage of the transistor 121.

At S330, the protection circuit 140, which is self-powered that does not rely on the electric energy stored on the capacitor 123, counteracts to the voltage change of the transistor 121. For example, the gate voltage increase causes the transistor 121 to be turned on, and pulls up the source voltage $V_{SOURCE}$ at the source terminal of the transistor 121. The source voltage increase at the source terminal of the transistor 121 is coupled to the gate terminal of the transistor 141 via the capacitor 142. The gate voltage increase of the transistor 141 turns on the transistor 141 to form a discharging path to pull down the voltage at the gate terminal of the transistor 121. After a time duration determined by the resistor 143, the transistor 141 is turned off and the discharging path is disabled. Then, the process proceeds to S399 and terminates.

Figure 4A:
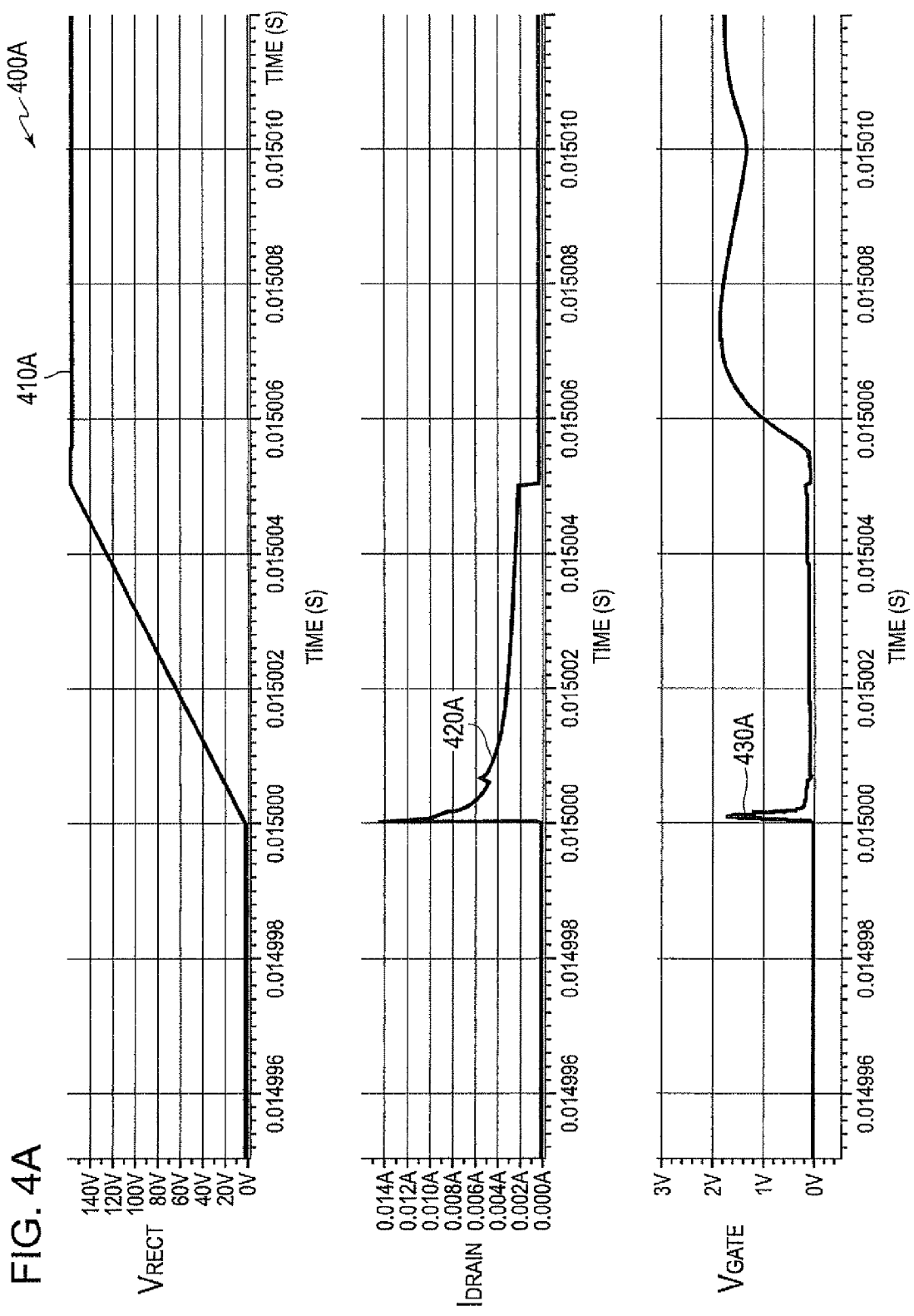

FIGS. 4A-4B show waveforms according to an embodiment of the disclosure.

FIG. 4A shows a plot 400A of waveforms when the circuit 110 includes the protection circuit 140 to avoid entrance of a large amount of electric energy during a period of step voltage change in the power supply. The plot 400A includes a first waveform 410A for the rectified voltage $V_{RECT}$, a second waveform 420A for the drain current $I_{DRAIN}$ of the transistor 121, and a third waveform 430A for the gate voltage $V_{GATE}$ of the transistor 121.

In FIG. 4A example, the dimmer 102 has a dimming angle of π/2, thus at about time 0.015 seconds, the rectified voltage $V_{RECT}$ has a step voltage change, for example, from zero to 150V in 5 µs. The step voltage change causes the gate voltage $V_{GATE}$ of the transistor 121 to increase and turns on the transistor 121 temporally and allows drain current $I_{DRAIN}$ to enter the circuit 110. When the transistor 121 is turned on, the source voltage of the transistor 121 is pulled up. The source voltage increase of the transistor 121 is coupled to the gate terminal of the transistor 141 via the capacitor 142, and turns on the transistor 141. The transistor 141 serves as a discharging path to discharge the gate terminal of the transistor 121 and pulls down the gate voltage $V_{GATE}$ of the transistor 121. Because the protection circuit 140 works in a self-powered and self-controlled manner, and thus responds to the step voltage change in a relatively fast speed. Then, the gate voltage $V_{GATE}$ increase is relatively small, such as about 1.6V and lasts for a relatively short time period, such as less than 0.2 µs. Thus, a relatively small amount of drain current $I_{DRAIN}$, such as less than 0.015 A, enters the circuit 110, during the short time period. Thus, the total electric energy that enters into the circuit 110 due to the step voltage change has been reduced.

FIG. 4B shows a plot 400B of waveforms when the circuit 110 does not include the protection circuit 140. The plot 400B includes a first waveform 410B for the rectified voltage VRECT, a second waveform 420B for the drain current $I_{DRAIN}$ of the transistor 121, and a third waveform 430B for the gate voltage $V_{GATE}$ of the transistor 121.

In FIG. 4B example, the dimmer 102 has a dimming angle of n/2, thus at about time 0.015 seconds, the rectified voltage $V_{RECT}$ has a step voltage change, for example, from zero to 150V in 5 µs. The step voltage change causes the gate voltage $V_{GATE}$ of the transistor 121 to increase and turns on the transistor 121 and allows drain current $I_{DRAIN}$ to enter the circuit 110. Because the gate control circuit 131 is not fast enough to respond to the step voltage change during the time period (e.g., 5 µs) when the step voltage change happens, the gate voltage $V_{GATE}$ is relatively high, such as at 15V, and the drain current $I_{DRAIN}$ is also relatively high, such as over 0.2 A during the time period (e.g., 5 µs). Because the rectified voltage $V_{RECT}$ is also high, a relatively large amount of electric energy enters the circuit 110 during time period when the step voltage change happens, and may cause damage to the circuit 110.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:
1. A circuit, comprising:
    a transistor configured to control energy entering the circuit from a power supply;
    a capacitor coupled with the transistor to store the energy that enters the circuit;
    a protection circuit configured to counteract a gate voltage change on a gate terminal of the transistor that is caused by a step voltage change in the power supply, wherein the protection circuit is configured to operate independent of the energy stored on the capacitor; and a control circuit configured to control the transistor based on the energy stored on the capacitor, wherein the protection circuit is configured to counteract the gate voltage change on the gate terminal of the transistor that is caused by the step voltage change in the power supply before the control circuit is able to react to the gate voltage change on the gate terminal of the transistor that is caused by the step voltage change in the power supply.

2. The circuit of claim 1, wherein the transistor is a depletion mode transistor.

3. The circuit of claim 1, wherein the transistor is a metal-oxide-semiconductor-field-effect-transistor (MOSFET).

4. The circuit of claim 1, wherein
the protection circuit is coupled to the gate terminal of the transistor, and
the control circuit is coupled to the gate terminal of the transistor.

5. The circuit of claim 1, wherein the protection circuit is coupled to the gate terminal of the transistor to counteract the gate voltage change on the gate terminal of the transistor caused by the step voltage change in the power supply.

6. The circuit of claim 5, wherein the transistor is a first transistor, and the protection circuit further comprises:
a second transistor configured to discharge the gate terminal of the first transistor in response to the step voltage change in the power supply.

7. The circuit of claim 6, wherein the protection circuit further comprises:
a resistor defining a time constant for the protection circuit to be operative.

8. The circuit of claim 7, wherein
the second transistor is coupled to the gate terminal of the first transistor, and
the control circuit is coupled to the gate terminal of the first transistor and to the capacitor.

9. The circuit of claim 8, wherein the capacitor is a first capacitor, and the circuit further comprises:
a second capacitor coupled between the first transistor and a gate terminal of the second transistor.

10. The circuit of claim 9, wherein the resistor is coupled between the gate terminal of the second transistor and a current terminal of the second transistor.

11. A method, comprising:
storing energy that enters into a circuit on a capacitor via a transistor configured to control the energy entering the circuit from a power supply;
receiving a step voltage change in the power supply, the step voltage change causing a voltage change on the transistor;
counteracting the voltage change on the transistor by discharging a gate terminal of the transistor in response to the step voltage change by a protection circuit that operates independent of the energy stored on the capacitor; and
controlling the transistor to charge the capacitor and maintain a voltage on the capacitor by a control circuit that operates based on the energy stored on the capacitor,
wherein counteracting the voltage change on the transistor includes counteracting the voltage change on the transistor in response to the step voltage change in the power supply by the protection circuit before the control circuit is able to react to the voltage change on the transistor in response to the step voltage change in the power supply.

12. The method of claim 11, wherein storing the energy that enters into the circuit on the capacitor via the transistor that controls the energy entering the circuit from the power supply comprises:
storing the energy that enters into the circuit on the capacitor via a depletion mode transistor.

13. The method of claim 11, wherein storing the energy that enters into the circuit on the capacitor via the transistor that controls the energy entering the circuit from the power supply comprises:
storing the energy that enters into the circuit on the capacitor via a metal-oxide-semiconductor-field-effect-transistor (MOSFET).

14. The method of claim 11, wherein the voltage change on the transistor is a gate voltage change on the gate terminal of the transistor.

15. The method of claim 11, wherein discharging the gate terminal of the transistor in response to the step voltage change comprises:
discharging the gate terminal of the transistor for a time duration defined based on a resistor.

16. An electronic system, comprising:
a rectifier configured to receive and rectify an AC power supply and generate a rectified power supply; and
a circuit comprising:
a transistor configured to control energy entering the circuit from the rectified power supply;
a capacitor coupled with the transistor to store the energy that enters the circuit;
a protection circuit configured to counteract a gate voltage change on a gate terminal of the transistor that is caused by a step voltage change in the rectified power supply, wherein the protection circuit is configured to operate independent of the energy stored on the capacitor; and
a control circuit configured to control the transistor based on the energy stored on the capacitor,
wherein the protection circuit is configured to counteract the gate voltage change on the gate terminal of the transistor that is caused by the step voltage change in the rectified power supply before the control circuit is able to react to the gate voltage change on the gate terminal of the transistor that is caused by the step voltage change in the rectified power supply.

17. The electronic system of claim 16, further comprising:
a dimmer configured to stop the AC power supply for a dimming angle in an AC cycle to cause the step voltage change.

18. The electronic system of claim 16, wherein the transistor is a metal-oxide-semiconductor-field-effect-transistor (MOSFET).

19. The electronic system of claim 16, wherein the protection circuit is coupled to the gate terminal of the transistor to counteract the gate voltage change on the gate terminal of the transistor caused by the step voltage change in the power supply.

20. The electronic system of claim 19, wherein the transistor is a first transistor, and the protection circuit further comprises:
a second transistor configured to discharge the gate terminal of the first transistor in response to the step voltage change in the power supply; and
a resistor defining a time constant for the protection circuit to be operative.

21. The electronic system of claim 16, further comprising:
a dimmer coupled between the AC power supply and the rectifier.

\* \* \* \* \*